United States Patent [19]

Saito et al.

[11] Patent Number: 4,621,190

[45] Date of Patent: Nov. 4, 1986

[54] CARD WITH AN IC MODULE

[75] Inventors: Tamio Saito; Hiroshi Kobayashi, both of Tokyo; Shigekazu Hori, Yokohama, all of Japan

[73] Assignee: Kabushiki Kaisha Toshiba, Kawasaki, Japan

[21] Appl. No.: 618,381

[22] Filed: Jun. 7, 1984

[30] Foreign Application Priority Data

Jun. 9, 1983 [JP] Japan ................. 58-103346

[51] Int. Cl.⁴ ............................ G06K 19/06
[52] U.S. Cl. .................... 235/492; 235/380
[58] Field of Search ............... 235/492, 455, 441, 379, 235/380

[56] References Cited

U.S. PATENT DOCUMENTS

| 4,001,550 | 1/1977 | Schatz ..................... 235/379 |
| 4,004,133 | 1/1977 | Hannan et al. ................ 235/492 X |
| 4,007,355 | 2/1977 | Moreno ..................... 235/441 X |
| 4,272,758 | 6/1981 | Girand ..................... 235/380 X |
| 4,417,413 | 11/1983 | Hoppe et al. ................ 235/441 X |
| 4,447,716 | 5/1984 | Algo ..................... 235/492 |
| 4,463,971 | 8/1984 | Hoppe et al. ................ 235/492 X |
| 4,480,178 | 10/1984 | Miller et al. .............. 235/380 |
| 4,483,067 | 11/1984 | Parmentier ................ 235/492 X |

FOREIGN PATENT DOCUMENTS

| 0019280 | 11/1980 | European Pat. Off. . |
| 57-52977 | 3/1982 | Japan . |
| 57-188849 | 11/1982 | Japan . |

*Primary Examiner*—David L. Trafton
*Attorney, Agent, or Firm*—Oblon, Fisher, Spivak, McClelland & Maier

[57] ABSTRACT

The credit card includes an IC module having a data processing function, an insulation body for holding the IC module, and a plurality of terminals which are formed on the insulation body. The plurality of terminals are first and second contact pads to which a drive power and a data signal are supplied. The IC module is formed between the first and second contact pads.

19 Claims, 25 Drawing Figures

F I G. 5A
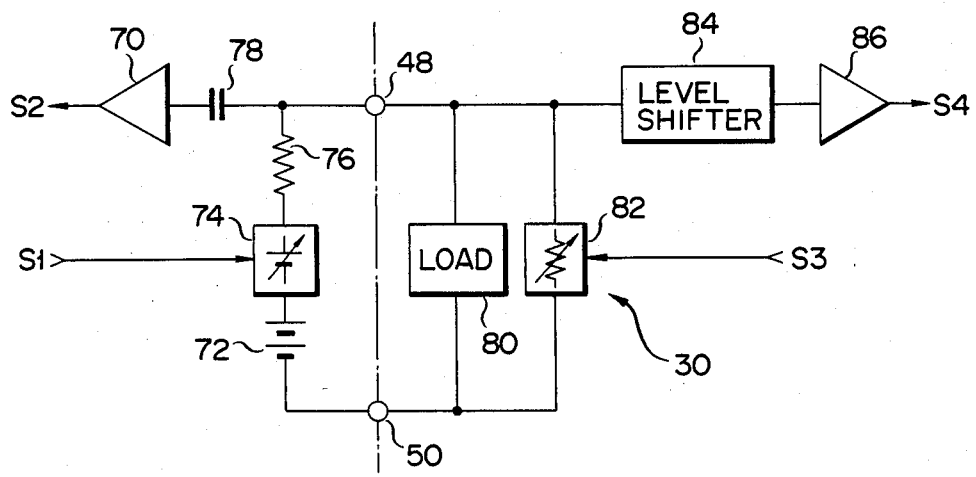
F I G. 5B
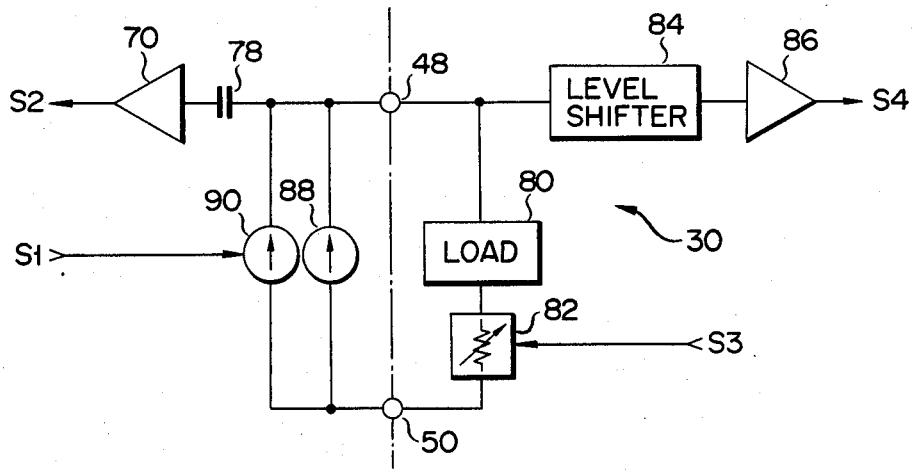

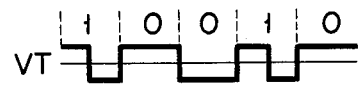
F I G. 12
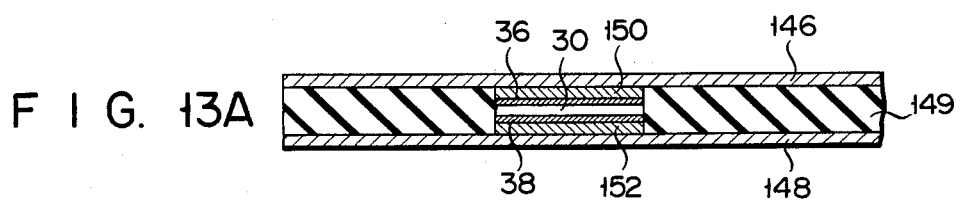
F I G. 13A
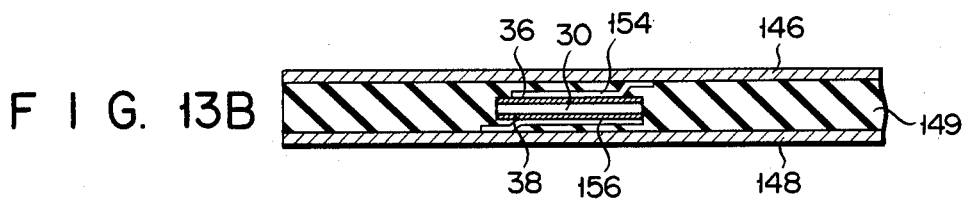
F I G. 13B
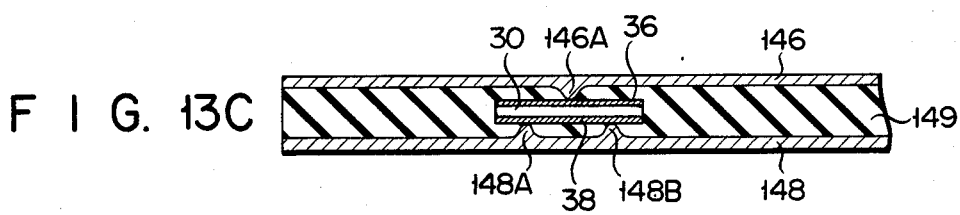
F I G. 13C
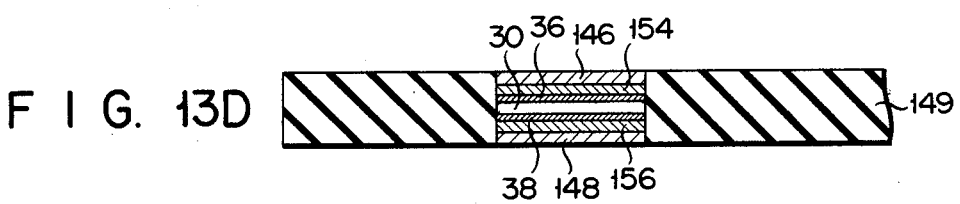
F I G. 13D
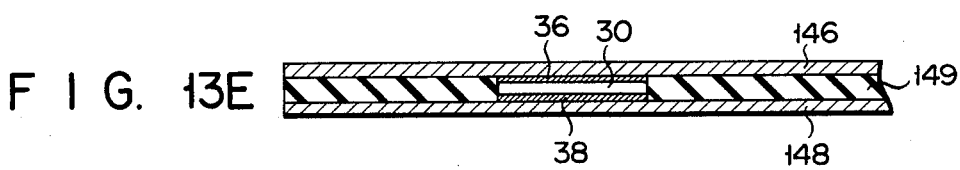
F I G. 13E

CARD WITH AN IC MODULE

BACKGROUND OF THE INVENTION

The present invention relates to a card with an internal IC module.

In recent years, many people have taken advantage of credit cards, ID cards or the like, the names and registration numbers, for example, of which can be discriminated with the use of a computer system. In such a card, generally, a magnetic tape for storing informations is pasted onto a plastic plate. On the other hand, with the remarkable progress in the integrating and packaging techniques of the semi-conductor circuit, a card has been developed in which the IC module having a data processing function is embedded in, for example, a plastic plate, this type of card being now at a stage of being put to practical use.

FIG. 1 shows the outer appearance of a prior art credit card having a data processing function. This credit card has first terminals 10A and 10B for receiving a drive power from a external computer system and second terminals 10C to 10H for signal transmission and reception with the computer system, on a plastic plate 12. A magnetic tape 14 is formed on the plate 12 so as to conform to a conventional computer system as well. The plastic plate 12 has a groove 16 as shown in FIG. 2. In this groove 16, spacers 18 are provided. Each of the terminals 10A to 10H is adhered to a support plate 20 in a manner to extend from an upper surface to a bottom surface thereof. An IC module 22 is formed therein with a data processing circuit and mounted to the bottom surface of the support plate 20. The terminals 10A to 10H are connected, by lead wires, to the corresponding electrodes of the data processing circuit in IC module 22. The support plate 20 is adhered and received in a groove 16 of the plastic plate 12 jointly with the IC module 22. The external computer system supplies a drive power to the IC module 22 through the terminals 10A and 10B at the time of utilizing the credit card and, at the same time, transmits and receives data signals through the terminals 10C to 10H.

However, in this type of credit card having the above-mentioned construction, it is necessary to provide a space to receive the lead wires for connecting the IC module 22 and the electrodes 10, so that it is difficult to form the card to be sufficiently thin. Further, the wire bonding process makes the assembly operation complicated. Furthermore, since, in this card, a drive power and data signals are relayed by a relatively large number of terminals, the reliability of the card in connection with the external computer system is low.

SUMMARY OF THE INVENTION

In view of the above, the object of the present invention is to provide a card containing an IC module which has a structure suitable for being made thinner and which makes it possible to reliably supply power thereto from outside and to effect data communication between the card and the outside.

According to the present invention, there is provided a card comprising first and second terminal regions to which a drive power and an input signal are supplied, an IC module which is formed between the first and second terminal regions and has a data processing section for supplying an output signal to the first and second terminal regions in accordance with the input signal, and an insulation body for holding the IC module.

BRIEF DESCRIPTION OF THE DRAWINGS

FIGS. 5A and 5B respectively show the data communication circuits provided in the IC module of FIG. 3 and an external data processing unit;

FIG. 12 shows the waveform of diphase coded signal;

FIGS. 13A to 13E show the structures of a credit card according to another embodiment of the present invention;

DETAILED DESCRIPTION OF THE PREFERRED EMBODIMENTS

Figure 1:
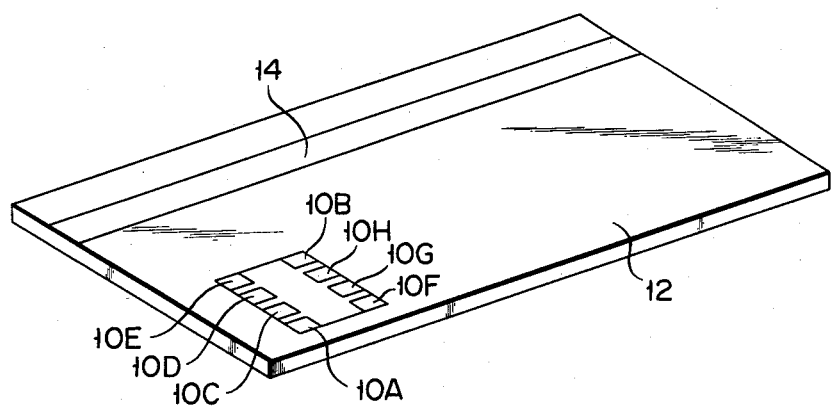
FIG. 1 shows the outer appearance of a prior art credit card having a data processing function.
Figure 2:
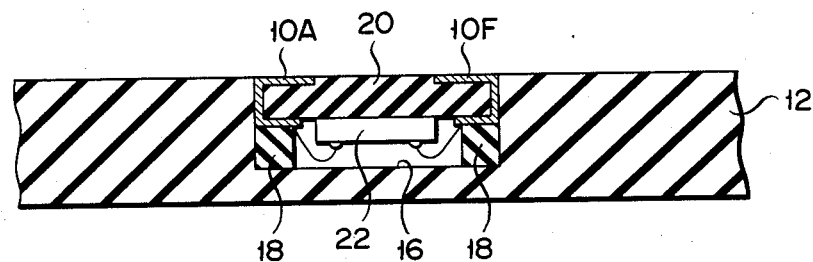
FIG. 2 shows an internal structure of the credit card shown in FIG. 1.
Figure 3:
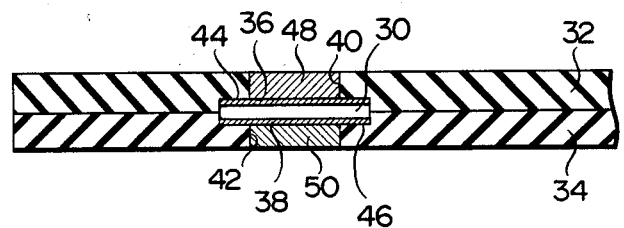
FIG. 3 is a view for explaining the structure of a credit card according to an embodiment of the present invention.

FIG. 3 shows a credit card according to an embodiment of the present invention. This credit card is provided with an IC module 30 having a data processing function and insulation body, for example, plastic plates 32, 34, for holding the IC module 30 therebetween. The IC module 30 has a pair of electrodes 36 and 38 which are respectively formed on an upper surface and bottom surface of the IC module. Plastic plates 32 and 34 have square openings 40 and 42, each having a T-shaped profile. The IC module 30 is sandwiched between the platforms formed by the wider portion of the openings 40, 42 when the plastic plates 32, 34 are pasted together. The electrodes 36 and 38 of the IC module 30 are joined with contact pads 48 and 50 made of, for example, conductive epoxy resin, which are fitted in the openings 40 and 42, respectively. These contact pads 48 and 50 can be connected to an external data processing unit (not shown) for data communication with the same.

Figure 4A:
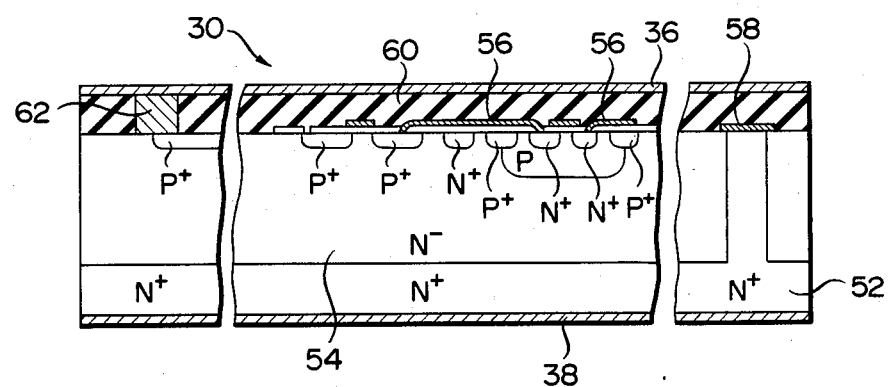
FIGS. 4A and 4B show the structures of the IC module showh in FIG. 3, respectively.
Figure 4B:
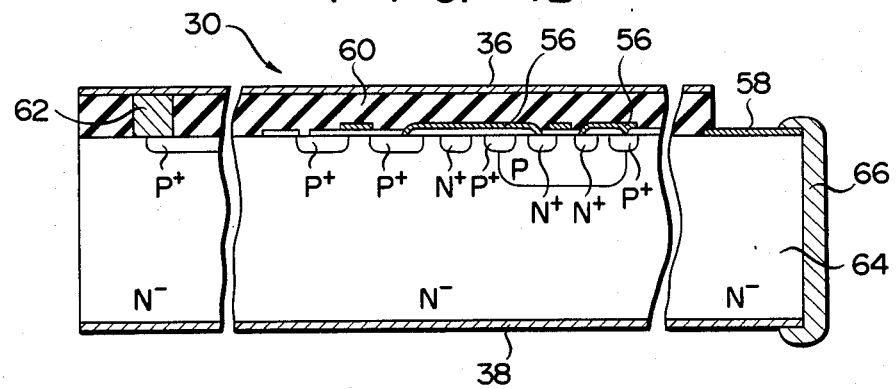

The IC module 30 of FIG. 3 is made into a monolithic structure such as that shown in FIG. 4A or FIG. 4B. The IC module 30 of FIG. 4A is provided with a semiconductor substrate 52 of $n^+$ conductivity type, a layer 54 of $n^-$ conductivity type formed on the substrate 52, and a data processing circuit formed in the surface area of the layer 54. Logic elements of the data processing circuit are connected to each other by a conductive layer 56 such as that formed of aluminum. A reference potential terminal 58 of the data processing circuit is formed in contact with the upper surface of the substrate 52 while, on the other hand, an electrode 38 is formed incontact with the bottom surface of the substrate 52. The data processing circuit is covered by an insulation layer 60 such as, for example, that made of polyimide, silicon oxide or silicon nitride. The electrode 36 is formed, for example, by deposition, on the insulation layer 60, and is joined to a source potential terminal 62 of the data processing circuit. The electrodes 36 and 38 serve as power source terminals for receiving a drive voltage used to operate the data processing circuit and, at the same time, as data input/output terminals of IC module 30.

The IC module 30 of FIG. 4B is provided with a semiconductor substrate 64 of n⁻ conductivity type, and a data processing circuit formed in the surface area of the substrate 64. The reference potential terminal 58 of the data processing circuit is formed in contact with the upper surface of the substrate 64, while, on the other hand, the electrode 38 is formed in contact with the bottom surface of the substrate 64. The reference potential terminal 58 and electrode 38 are connected, for example, by silver paste, to a conductive layer 66 such as that made of conductive epoxy resin which is adhered to a side surface of the substrate 64. In FIG. 4B, the portions other than those mentioned in connection with FIG. 4A are formed in the same manner as in FIG. 4A.

In order to effect the power supply and data transfer through the pair of contact pads 48 and 50, a communication circuit shown, for example, in FIG. 5A or 5B is added to the external data processing unit and the IC module 30. FIG. 5A schematically shows the communication circuit arranged to transfer data in the form of a voltage signal. In the case of FIG. 5A, the external data processing unit is provided with a sense amplifier 70, a constant D.C. voltage source 72 for generating a constant voltage VO of, for example, 5 (v), a variable D.C. voltage source 74 for supplying a voltage VS, for example, either one of voltages 0 (v) and 0.4 (v), which corresponds to the value of a transmission data S1 generated in the data processing unit, and a resistor 76 having a resistance value R of, for example, 100($\Omega$), and serving as a means of detecting the level of the current therethrough. The constant voltage source 72, variable voltage source 74 and resistor 76 are connected in series between the contact pads 48 and 50. A voltage signal from the contact pad 48 is supplied to the sense amplifier 70 through a capacitor 78 serving to inhibit the D.C. power component. This sense amplifier 70 produces reception data S2 having a value corresponding to the input voltage.

On the other hand, the data processing circuit of the IC module 30 is provided with a load 80 containing, for example, CPU, memory, etc., and a variable resistance circuit 82 capable of producing a resistance RS, for example, of either infinity or 575($\Omega$), which corresponds to the transmission data S3 generated in the data processing circuit. The load 80 and variable resistance circuit 82 are respectively connected between the contact pads 48 and 50. The contact pad 48 is connected to an input terminal of a sense amplifier 86 through a level shifter 84 serving to inhibit a D.C. component of the voltage signal. The sense amplifier 86 generates reception data S4 having a value corresponding to the input voltage.

Reference will now be made to the operation performed when the digital data S1 is sent from the external data processing unit to the credit card. In this case, the CPU in the IC module 30 does not generate the transmission data S3. As a result, the resistance value of the circuit 82 becomes infinite. When the variable voltage source 74 generates a voltage VS in response to the transmission data S1, a voltage $$\frac{RL}{RL + R} \cdot (VO + VS)$$

is supplied between the contact pads 48 and 50. (In this formula, R represents the resistance of the resistor 76, RL the resistance of the load 80, VO the voltage of the constant D.C. voltage source 72, and VS the voltage of the variable D.C. voltage source 74.) The sense amplifier 86 amplifies the voltage signal $$\frac{RL}{RL + R} \cdot VS$$

whose D.C. power component is removed by the level shifter 84 and produces this voltage signal as reception data S4.

On the other hand, in the operation performed when the digital data S3 is supplied from the credit card to the external data processing unit, the transmission data S1 is not supplied to the variable voltage source 74, whereby the variable voltage source 74 is set at a voltage of 0 (v). At this time, when the transmission data S3 is input to the variable resistance circuit 82, the following voltage is supplied to the sense amplifier 70 through the capacitor 78.

$$\left( \frac{1}{\frac{RL + RS}{RL \cdot RS} + R} - \frac{1}{RL + R} \right) VO \cdot R =$$

$$\frac{R \cdot RL^2}{(RL + R)(RL \cdot RS + R \cdot RL + R \cdot RS)} VO$$

The sense amplifier 78 amplifies this voltage and produces the resultant voltage as the reception data S2. In this case, it is assumed that the load 80 has a substantially constant resistance value. When, for example, RL=100$\Omega$, R=100$\Omega$, RS=575$\Omega$, VS=0.4 V, and VO=5 V as mentioned before, the input voltage of the sense amplifiers 70 and 86 has an amplitude of about 0.2 V which is generally capable of being sufficiently sensed in the form of a signal.

FIG. 5B shows a communication circuit so arranged as to transfer data in the form of a current signal. This communication circuit has a constant current source 88 and a variable current source 90 in place of the constant voltage source 72 and variable voltage source 74 shown in FIG. 5A. The current source 88 generates a constant current IO of, for example, 25 mA. The variable current source 90 generates a current IS, for example, either of 0 (A) or 2 m(A), which corresponds to the transmission data S1. The constant current source 88 and variable current source 90 are connected between the contact pads 48 and 50 in parallel. The sense amplifier 70, capacitor 78, constant current source 88 and variable current source 90 are provided in the external data processing unit. In the IC module 30, the load 80, variable resistance circuit 82, level shifter 84 and sense amplifier 86 are provided as in the case of FIG. 5A. In FIG. 5B, however, the load 80 and variable resistance circuit 82 are connected in series between the contact pads 48 and 50. The variable resistance circuit 82 produces a resistance RS, for example, of either 0(Ω) or 8(Ω), in response to the transmission data S3.

When digital data S1 is supplied from the external data processing unit to the credit card, the CPU in the IC module 30 is not allowed to generate transmission data S3, and the variable resistance circuit 82 is set at a resistance value of 0Ω. When the variable current source 90 generates a current IS in response to the transmission data S1, a square-wave voltage having an amplitude of IS·RL is applied to the sense amplifier 86, which produces the thus amplified square-wave voltage as the reception data S4.

On the other hand, in the operation performed when a digital data S3 is transmitted from the credit card to the external data processing unit, the transmission data S1 is not supplied to the variable current source 90, whereby the same does not produce any current. When, at this time, the transmission data S3 is input to the variable resistance circuit 82, the sense amplifier 70 receives a square-wave voltage of IO·RS. As a result, the amplified square-wave voltage is output from the sense amplifier 70 as the reception data S2. When it is assumed that, for example, RL=100Ω, RS=8Ω, IO=25 mA and IS=2 mA as mentioned before, the input voltage of the sense amplifiers 70 and 86 come to have an amplitude of about 0.2 V capable of permitting this input voltage to be sufficiently detected as a signal.

Although, in the foregoing description, it is assumed that the equivalent internal resistance of the load 80 is constant, actually the resistance value of the load 80 varies depending upon its operational conditions.

When the resistance value of the load 80 varies, noise voltage causing an erroneous operation can be supplied to the sense amplifier 86 together with the signal voltage. In order to attain a signal/noise ratio of not less than 10 dB, it is required to suppress the fluctuation of resistance of the load 80 of FIGS. 5A and 5B within the range of ±30% and ±2.5%, respectively when the noise voltage varies at a frequency higher than that of transmission or reception signal. Accordingly, the communication circuit of FIG. 5A is better than that of FIG. 5B in respect to the S/N ratio.

Figure 6A:
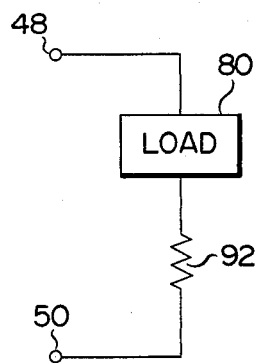
FIGS. 6A to 6D show a circuit used to compensate for the fluctuation in resistance value of a load shown in FIG. 5A or FIG. 5B.
Figure 6B:
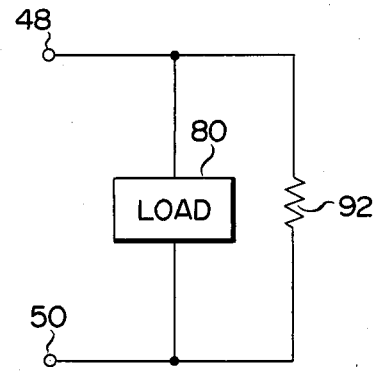

If a resistor 92 is connected in series or in parallel to the load 80 of FIGS. 5A or 5B as shown in FIGS. 6A or 6B, the noise voltage supplied to the sense amplifier 86 is decreased.

Figure 6C:
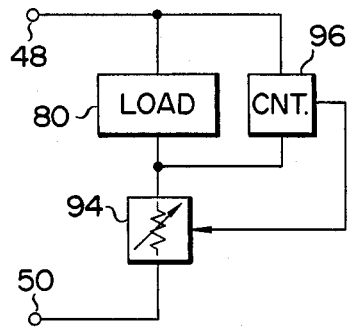
Figure 6D:
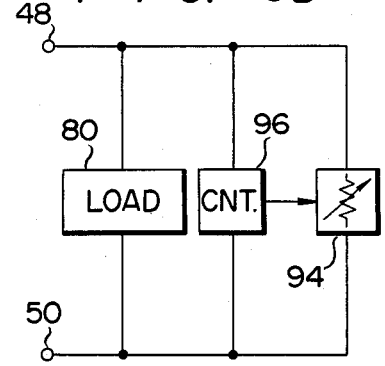

Further, if a variable resistance circuit 94 is connected in series or in parallel to the load 80 of FIGS. 5A or 5B as shown in FIGS. 6C or 6D, and further if a circuit 96 for controlling the resistance value of the variable resistance circuit 94 in accordance with a voltage drop in the load 80 is connected to the load 80 so as to compensate for the fluctuation in resistance value of the load 80, the noise voltage will be more effectively decreased.

Figure 7:
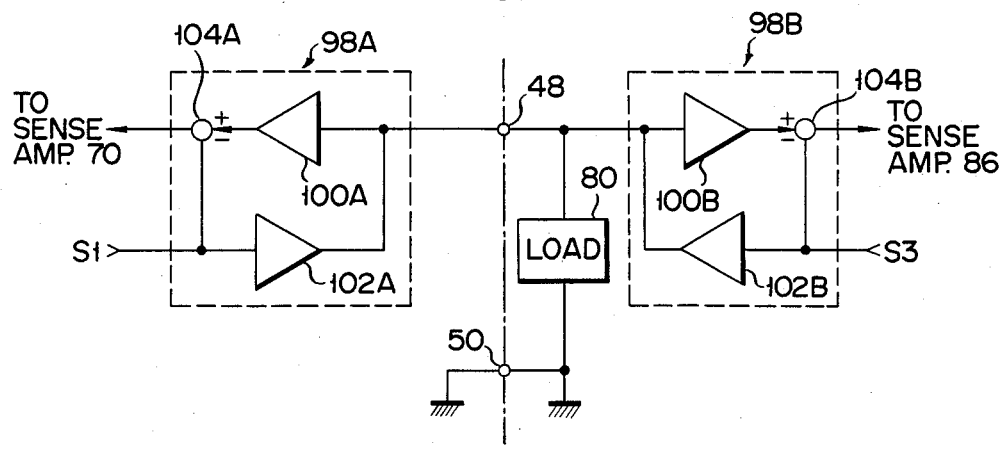
FIG. 7 shows a data communication circuit for the simultaneous bidirectional transfer of data between the IC module of FIG. 3 and the external data processing unit.

Further, the capacitor 78, constant voltage source 72 and variable voltage source 74 of the communication circuit shown in FIG. 5A can be constructed with the use of a hybrid circuit 98A shown in FIG. 7 while, on the other hand, the variable resistance circuit 82 and the level shifter 84 can be constructed with the use of a hybrid circuit 98B shown in FIG. 7. In FIG. 7, a buffer amplifier 102A supplies a voltage signal corresponding to the transmission data S1 to buffer amplifiers 100A and 100B, while, on the other hand, a buffer 102B supplies a voltage signal corresponding to the transmission data S3 to the buffer amplifiers 100B and 100A. Accordingly, the buffer amplifiers 100A and 100B generate the voltage signals corresponding to the transmission data S1 and S3. Subtracters 104A and 104B respectively remove the voltage components of the transmission data S1 and S3 from the output voltages of the buffer amplifiers 100A and 100B, respectively. Thus, it becomes possible to effect a simultaneous bidirectional transfer of data S1 and S3 between the external data processing unit and the IC module of the credit card.

Figure 8:
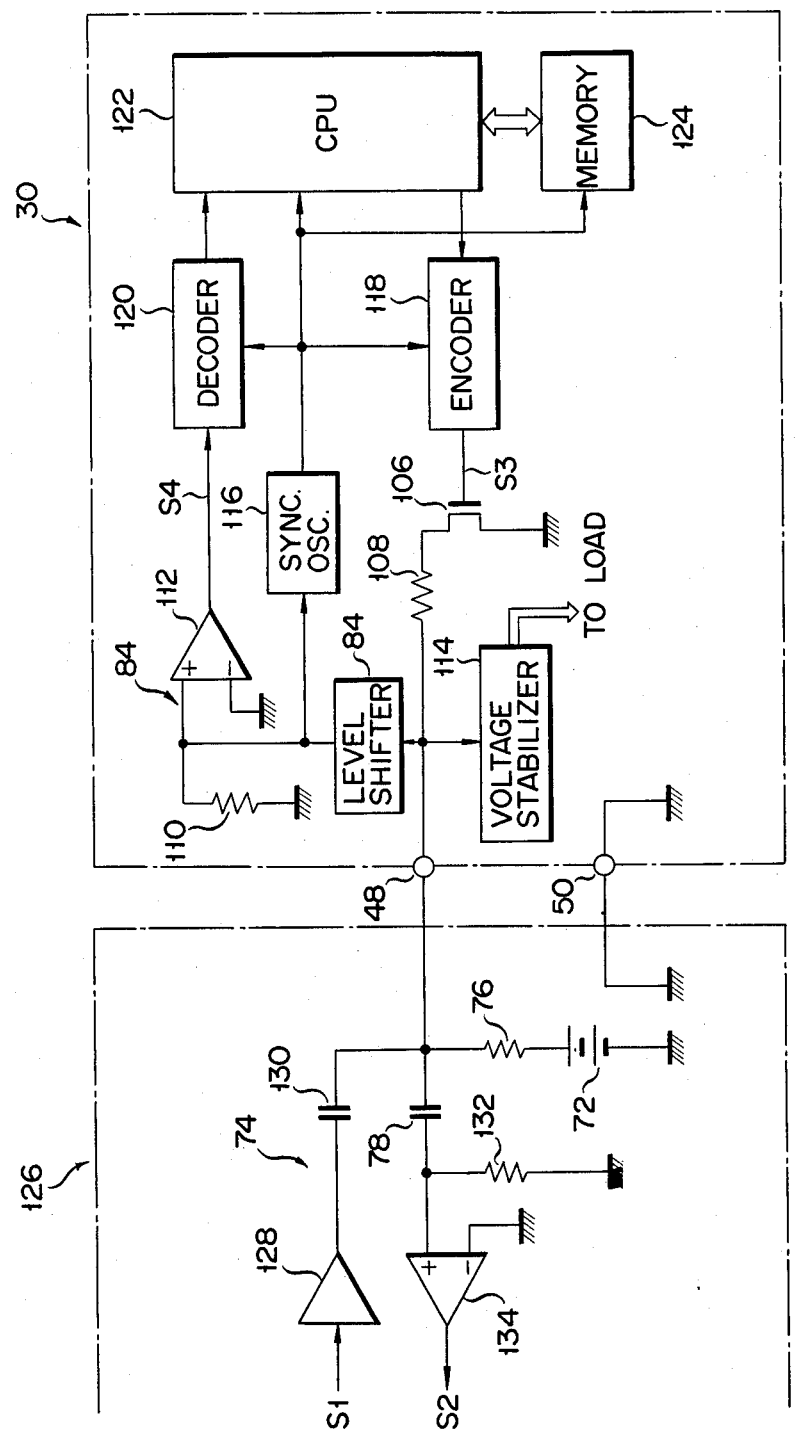
FIG. 8 is a detailed view of the data communication circuit of FIG. 5A.

FIG. 8 shows in detail the communication circuit of FIG. 5A. In the IC module 30, a MOS transistor 106 and a resistor 108 correspond to the variable resistance circuit 82 shown in FIG. 5A, and the switching of the MOS transistor 106 is controlled by the transmission data S3. A resistor 110 and a comparator 112 constitute the sense amplifier 86. A voltage stabilizer 114 supplies a stabilized drive voltage to each and every circuit in the IC module 30 including a synchronizing oscillator 116, encoder 118, decoder 120, CPU 122, memory 124, etc. The total sum of the resistances of the circuits in the IC module 30 including the voltage stabilizer 114 is equivalent to the resistance of the load 80 shown in FIG. 5A. On the other hand, in the external data processing unit 126, a driver 128 and a capacitor 130 correspond to the variable voltage source 74 shown in FIG. 5A. Further, a resistor 132 and a comparator 134 correspond to the sense amplifier 70 shown in FIG. 5A. In FIG. 8, the same portions as those shown in FIG. 5A are denoted by the same reference numerals.

Figure 9:
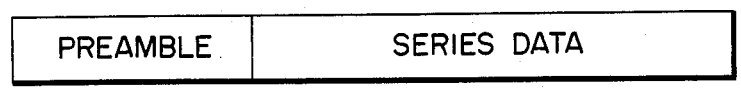
FIG. 9 shows a format of transmission data.
Figure 10:
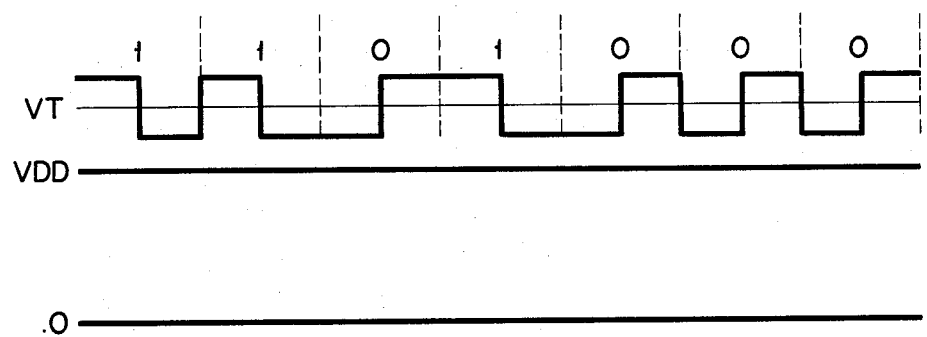
FIG. 10 shows the waveform of Manchester coded signal.

To further explain the communication operation, the transmission data S1 is constituted, as shown in FIG. 9, by a preamble and a series data immediately succeeding to this preamble, this preamble being used to synchronize the operation in the IC module 30 with that in the external data processing unit. Further, an error correction data for CRC operation for example, may be added to the series data in a manner to succeed to the same, if necessary. Such a transmission data S1 is supplied to the driver 128 and capacitor 130 in the form of, for example, a Manchester code wherein a clock signal is overlapped. In this case, IC module 30 receives a signal as shown in FIG. 10. The synchronizing oscillator 116 extracts a clock component from the output signal of the level shifter 84 and generates a clock signal of a high frequency which is synchronous to the output signal of the level shifter 84. The output signal of the synchronizing oscillator 116 is supplied to the encoder 118, decoder 120, CPU 122 and memory 124. On the other hand, the output signal of the level shifter 84 has its wave shaped by the comparator 112 and, at the same time, is amplified and supplied to the decoder 120 as reception data S4. The decoder 120 decodes the reception data S4 and supplies it to the CPU 122. Further, when the CPU 122 supplies the transmission data S3 having a preamble to the encoder 118, this encoder 118 overlaps the transmission data S3 with the clock signal from the synchronizing oscillator 116 which is in a state of free running. The transistor 106 has its conduction controlled by the output signal of the encoder 118. When the current allowed to flow through the resistor 108 by the switching of the transistor 106 is varied, this variation is transferred to the comparator 134 through the capacitor 78. The comparator 134 detects this variation in current and amplifies the same. The output signal of the comparator 134 is supplied to a decoder (not shown). Further, the voltage stabilizer 114 extracts a specified D.C. power component VDD which is lower than the average voltage VT of a voltage signal shown in FIG. 10.

It should be noted here that the voltage stabilizer 114 is provided with a resistance circuit shown in FIGS. 6A, 6B, 6C or 6D for the purpose of keeping the equivalent internal resistance constant. Further, in order to remove the D.C. component at the level shifter 84, it is preferable to utilize a voltage drop between the base and emitter of a transistor, or a forward voltage drop in a diode. However, it is also possible to utilize a capacitor of a small capacity for the reason that the input resistance of the comparator 112 is extremely large. Any of these elements can be formed in the monolithic IC module 30.

Figure 11:
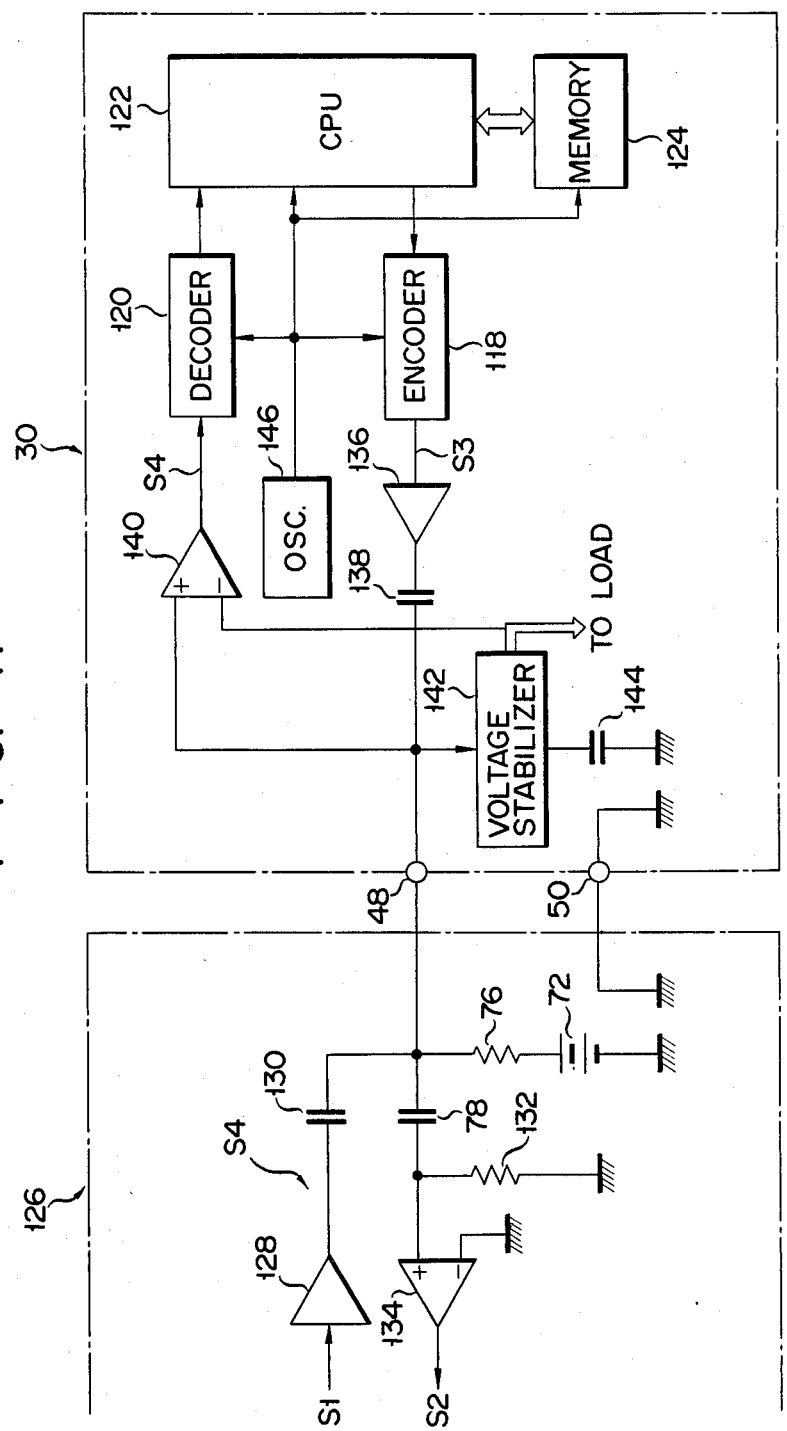
FIG. 11 is a detailed view of the data communication circuit of FIG. 5B.

FIG. 11 shows another example of the construction of the IC module 30. In this construction, the transistor 106 and resistor 108 in FIG. 8 are replaced by a driver 136 and a capacitor 138, respectively, and an output terminal of this driver 136 is connected to the contact pad 48 through the capacitor 138. Further, the level shifter 84, resistor 110 and comparator 112 involved in FIG. 8 are replaced by a comparator 140. Further, the voltage stabilizer 114 in FIG. 8 is replaced by a voltage stabilizer 142 having a voltage-booster function in cooperation with a capacitor 144. Further, the synchronizing oscillator 116 is replaced by an oscillator 146. Further, the transmission data S1 and S3 are transferred in the form of a diphase code shown in FIG. 12. A decoder 120 detects the pulse width of the diphase code in response to the clock signal supplied from the oscillator 146 kept under self-oscillation. The transmission data S3 from the CPU 122 is overlapped, in the encoder 118, with the clock signal from the oscillator 146, whereby it is made into a diphase code. The output signal of the encoder 118 is amplified by the driver 136 and is transmitted to the external data processing unit 126 through the capacitor 138. On the other hand, the voltage stabilizer 142 produces a voltage signal having the same level as an average level VT of the diphase code shown in FIG. 12. The comparator 140 utilizes the output voltage of the voltage stabilizer 142 as a reference voltage. For this reason, an input end of the comparator 140 is directly connected to the electrode 48 not by way of the level shifter 84 of FIG. 8. It should be noted here that since, in this embodiment, the capacitors 138 and 144 are each required to have a large capacitance, a chip capacitor is mounted on the IC module 30 in view of the existing level of manufacturing technique.

In the above-mentioned embodiments, the transmission data S1 and S3 are transferred with their base band. However, those transmission data S1 and S3 can be also overlapped with D.C. power after being converted into a modulated wave such as FM, AM, PM, etc. In this case, if the frequency of the carrier wave is selectively set to the HF and VHF band, it becomes possible to form the monolithic IC module 30 having the capacitors 138 and 144 therein because, in such a case, they may be formed to have a small capacitance.

FIGS. 13A to 13E show the structures of cards according to other embodiments of the present invention, respectively. The IC module 30 and electrodes 36 and 38 according to each of these embodiments are constructed in the same manner as explained in connection with FIG. 3, FIG. 4A and FIG. 4B.

In the card of FIG. 13A, electrodes 146 and 148 are formed on the entire upper and bottom surfaces of a insulation substrate 149, respectively, and conductive members 150 and 152 having resiliency such as a conductive rubber are formed between the electrodes 146 and 36 and between the electrodes 148 and 38, respectively.

In the card of FIG. 13B, the electrodes 146 and 148 are connected to the electrodes 36 and 38, respectively, by using springs 154 and 156 in place of the conductive rubber used in FIG. 13A.

In the card of FIG. 13C, projections 146A and 148A are integrally formed on the inner surfaces of the electrodes 146 and 148, respectively, and the electrodes 146 and 148 are connected to the electrodes 36 and 38, respectively, in a state in which the IC module 30 is sandwiched between the projections 146A and 148A through the electrodes 36 and 38, respectively.

In the card of FIG. 13D, the structure is the same as that of FIG. 13A except that the electrodes 146 and 148 are provided in parts of the insulation substrate 149, respectively.

In the card of FIG. 13E, the electrodes 146 and 148 are formed of conductive materials having a resiliency such as conductive rubber or conductive plastic and are respectively directly connected to the electrodes 36 and 38 of the IC module 30. If, in this case, the insulation substrate 149 is also formed of a resilient material such as soft rubber, then the card as a whole will have a resiliency.

The structure of the credit card according to the present invention can be modified variously. For example, connecting the electrodes 146 and 148 to the electrodes 36 and 38 may be effected with the use of wires.

Figure 14:
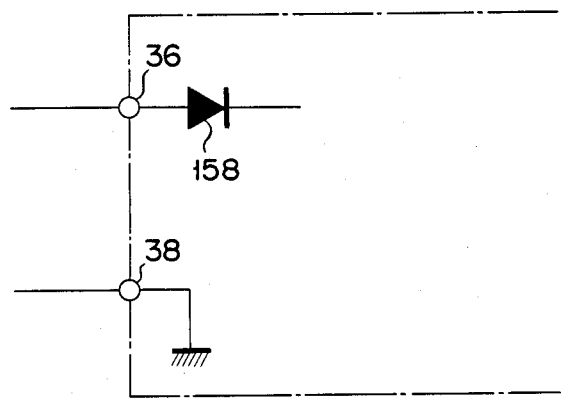
FIG. 14 shows a circuit used to enable the card to be loaded upside down into the external data processing unit.

By the way, where, in the circuit construction of FIG. 8 or FIG. 11, the card is inserted upside down in the external data processing unit, it is possible that current can flow in the reverse direction damaging the circuit in the IC module 30. FIG. 14 shows an embodiment which makes it possible to insert the card upside down. In this embodiment, IC module 30 has a diode 158 connected to the electrode 36, whereby a D.C. power and a data signal are supplied to the circuits in the IC module 30 through that diode 158. With this construction, the circuits are not broken or damaged even when the card is inserted upside down in the external data processing unit. Further, with such a construction, it is also possible to arrange as follows. That is to say, when the card is inserted, the external data processing unit detects the current allowed to flow into the IC module 30, whereby, if a proper current is flowing, the unit starts transferring a data signal into the IC module 30. Reversely, if a proper current is not flowing, the direction of the connection of the unit with the electrodes 36 and 38 of the IC module 30 is automatically reversed on the side of the unit, whereby, after the unit confirms that a proper current starts to flow, the unit starts transferring a data signal.

Figure 15A:
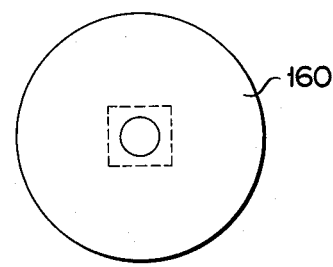
FIGS. 15A and 15B are views for explaining the planar and sectional structures of a card shaped like a coin, respectively.
Figure 15B:
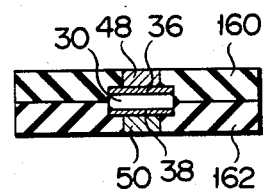

FIGS. 15A and 15B show an embodiment wherein the IC module 30 of such a construction is applied to what is called an "electronic coin." In this embodiment, the IC module 30 is sandwiched and fixed between two circular insulation substrates 160 and 162, whereby the electrodes 36 and 38 of the IC module 30 are connected to the electrodes 48 and 50, respectively. This type of coin can be used with respect to, for example, an automatic vender in the same manner as in an ordinary coin without paying any attention to the front and back sides.

According to the present invention, the communication circuit of FIG. 5A or 5B can be modified such that a drive power for the IC module 30 and data are transferred between the external data processing unit and the IC module 30 through the medium of, for example, light. In this case, a credit card may have a solar battery, for example, formed of amorphous silicon and a light emitting element, for example, photo diode instead of the contact pads 48, 50. Further, the contact pads can be replaced by a piezoelectric element and an antenna for respectively utilizing sound and electromagnetic wave as a communication medium.

What is claimed is:

1. A card comprising:
   an insulation substrate;
   an IC module which is formed in said insulation substrate and has data processing means for generating an output signal in accordance with an input signal; and
   first and second conductive layers which are respectively formed on the substantially entire upper and bottom surfaces of said insulation substrate in contact with said IC module, and between which a drive power and input and output signals of said IC module are supplied.

2. A card according to claim 1, wherein said data processing means includes first and second electrodes respectively connected to said first and second conductive layers, an extraction circuit for separating the input signal from a composite of the drive power and input signals supplied from said first and second electrodes, and a data processing circuit which generates a reply data in accordance with the extracted input signal, and an output circuit for supplying to said first and second electrodes the output signal corresponding to the reply data.

3. A card according to claim 1, wherein said IC module further has a diode for blocking a reverse current to flow in said data processing means.

4. A card according to claim 1, wherein said IC module further has compensation means for compensating for the fluctuation of resistance of said data processing means.

5. A card according to claim 4, wherein said compensation means has a resistor connected to said data processing means in parallel.

6. A card according to claim 4, wherein said compensation means has a resistor connected to said data processing means in series.

7. A card according to claim 4, wherein said compensation means has a detector circuit which produces a control signal in accordance with the resistance of said data processing means, and a variable resistor circuit which is connected in parallel to said data processing means and generates a resistance in accordance with said control signal.

8. A card according to claim 4, wherein said compensation means has a detector circuit which produces a control signal in accordance with the resistance of said data processing means, and a variable resistor circuit which is connected in series to said data processing means and generates a resistance in accordance with said control signal.

9. A card according to claim 1, wherein said IC module has a monolithic construction.

10. A card according to claim 2, wherein said first and second conductive layers are formed of metal.

11. A card according to claim 10, wherein said first and second electrodes are respectively formed on the upper and bottom surfaces of said IC module.

12. A card according to claim 11, wherein said first and second electrodes are respectively connected to said first and second regions through conductive members having a resiliency.

13. A card according to claim 12, wherein said conductive members are conductive rubbers.

14. A card according to claim 12, wherein said conductive members are metal springs.

15. A card according to claim 13, wherein said first and second conductive layers have a plurality of projections formed in contact with said first and second electrodes of said IC module.

16. A card according to claim 2, wherein said first and second conductive layers, have a resiliency.

17. A card according to claim 1, wherein said insulation substrate is formed in a circular form.

18. A card comprising:
   an insulation substrate;
   an IC module which is formed in said insulation substrate and has data processing means for generating a predetermined output signal; and
   first and second conductive layers which are respectively formed on the substantially entire upper and bottom surfaces of said insulation substrate in contact with said IC module, and between which a drive power and output signal of said IC module are supplied.

19. A card according to claim 18, wherein said data processing means includes first and second electrodes respectively connected to said first and second conductive layers, a data processing circuit which generates predetermined data when the drive power is applied from said first and second electrodes, and an output circuit for supplying to said first and second electrodes the output signal corresponding to the predetermined data.

* * * * *